(12) United States Patent
Urakawa

(10) Patent No.: US 11,258,433 B1
(45) Date of Patent: Feb. 22, 2022

(54) SEMICONDUCTOR INTEGRATED CIRCUIT AND RECEIVING DEVICE

(71) Applicant: KIOXIA CORPORATION, Tokyo (JP)

(72) Inventor: Go Urakawa, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/190,917

(22) Filed: Mar. 3, 2021

(30) Foreign Application Priority Data

Sep. 16, 2020 (JP) .............................. JP2020-155725

(51) Int. Cl.
| | | |
|---|---|---|
| *H03K 3/017* | (2006.01) | |
| *H03K 5/00* | (2006.01) | |
| *G06F 1/04* | (2006.01) | |
| *H03K 19/20* | (2006.01) | |

(52) U.S. Cl.
CPC .............. *H03K 3/017* (2013.01); *G06F 1/04* (2013.01); *H03K 5/00006* (2013.01); *H03K 19/20* (2013.01); *H03K 2005/00078* (2013.01)

(58) Field of Classification Search
CPC .... H03K 3/017; H03K 19/20; H03K 5/00006; H03K 2005/00078; G06F 1/04
USPC ........................................................ 327/117
See application file for complete search history.

(56) References Cited

U.S. PATENT DOCUMENTS

| | | | | |
|---|---|---|---|---|
| 7,425,850 B2* | 9/2008 | Widerin | ........... | H03K 3/356104 327/115 |
| 7,466,251 B2* | 12/2008 | Uchino | ............... | H03M 1/0624 341/120 |
| 7,724,173 B2* | 5/2010 | Gustafsson | ......... | H03M 1/1215 341/159 |
| 8,587,460 B2* | 11/2013 | Noguchi | ............. | H03M 1/0624 341/118 |
| 8,718,214 B2* | 5/2014 | Aoki | .................... | H04L 25/0274 375/357 |
| 9,008,261 B2* | 4/2015 | Xiu | ...................... | H03K 23/667 377/47 |

(Continued)

FOREIGN PATENT DOCUMENTS

| | | |
|---|---|---|
| EP | 1821413 A1 | 8/2007 |
| JP | 2008-011189 A | 1/2008 |

(Continued)

OTHER PUBLICATIONS

Matteo Pisati, et. al., "A 243-mW 1.25-56-Gb/s Continuous Range PAM-4 42.5-dB IL ADC/DAC-Based Transceiver in 7-nm FinFET", IEEE Journal of Solid-State Circuits, vol. 55, No. 1, pp. 6-18, Jan. 2020.

*Primary Examiner* — Ryan Jager
(74) *Attorney, Agent, or Firm* — Kim & Stewart LLP

(57) ABSTRACT

A semiconductor integrated circuit includes a first circuit and a second circuit. The first circuit is configured to divide a first pulse signal having a first duty cycle by N (where N is an integer of 2 or more), and output 2×N second pulse signals of which phases are different from each other. The first pulse signal is a pair of differential signals. The second circuit is configured to receive one or more selection signals and calculate a logical product of one of the one or more selection signals and two of the 2×N second pulse signals to generate a third pulse signal having a second duty cycle less than the first duty cycle.

20 Claims, 10 Drawing Sheets

(56) References Cited

U.S. PATENT DOCUMENTS

| | | | | |
|---|---|---|---|---|
| 9,270,285 | B2* | 2/2016 | Kang | G11C 7/222 |
| 10,193,539 | B1* | 1/2019 | Choi | H03K 21/10 |
| 10,367,506 | B1* | 7/2019 | Chatwin | G11C 11/417 |
| 10,707,851 | B1* | 7/2020 | Song | G06F 1/10 |
| 10,924,120 | B1* | 2/2021 | John | H03K 5/1565 |
| 2001/0022537 | A1* | 9/2001 | Melava | H03K 23/68 |
| | | | | 331/16 |
| 2002/0172304 | A1* | 11/2002 | Saze | G11C 7/1087 |
| | | | | 375/340 |
| 2003/0193355 | A1* | 10/2003 | Leifso | H03K 23/544 |
| | | | | 327/115 |
| 2010/0253398 | A1* | 10/2010 | Seckin | H03K 23/68 |
| | | | | 327/118 |
| 2014/0197867 | A1* | 7/2014 | Xiu | G06F 1/08 |
| | | | | 327/105 |
| 2014/0361821 | A1* | 12/2014 | Connell | H03K 3/356104 |
| | | | | 327/218 |
| 2015/0236667 | A1* | 8/2015 | Kitsunezuka | H03H 11/12 |
| | | | | 327/557 |
| 2016/0099765 | A1* | 4/2016 | Hosokawa | H04B 7/084 |
| | | | | 375/347 |
| 2016/0182063 | A1* | 6/2016 | Seo | G11C 7/22 |
| | | | | 327/149 |
| 2017/0324402 | A1* | 11/2017 | Bagger | H03K 19/20 |
| 2021/0258030 | A1* | 8/2021 | Han | H04B 1/30 |

FOREIGN PATENT DOCUMENTS

| | | |
|---|---|---|
| JP | 4741681 B2 | 8/2011 |
| JP | 5288003 B2 | 9/2013 |
| WO | 2011071142 A1 | 6/2011 |

* cited by examiner

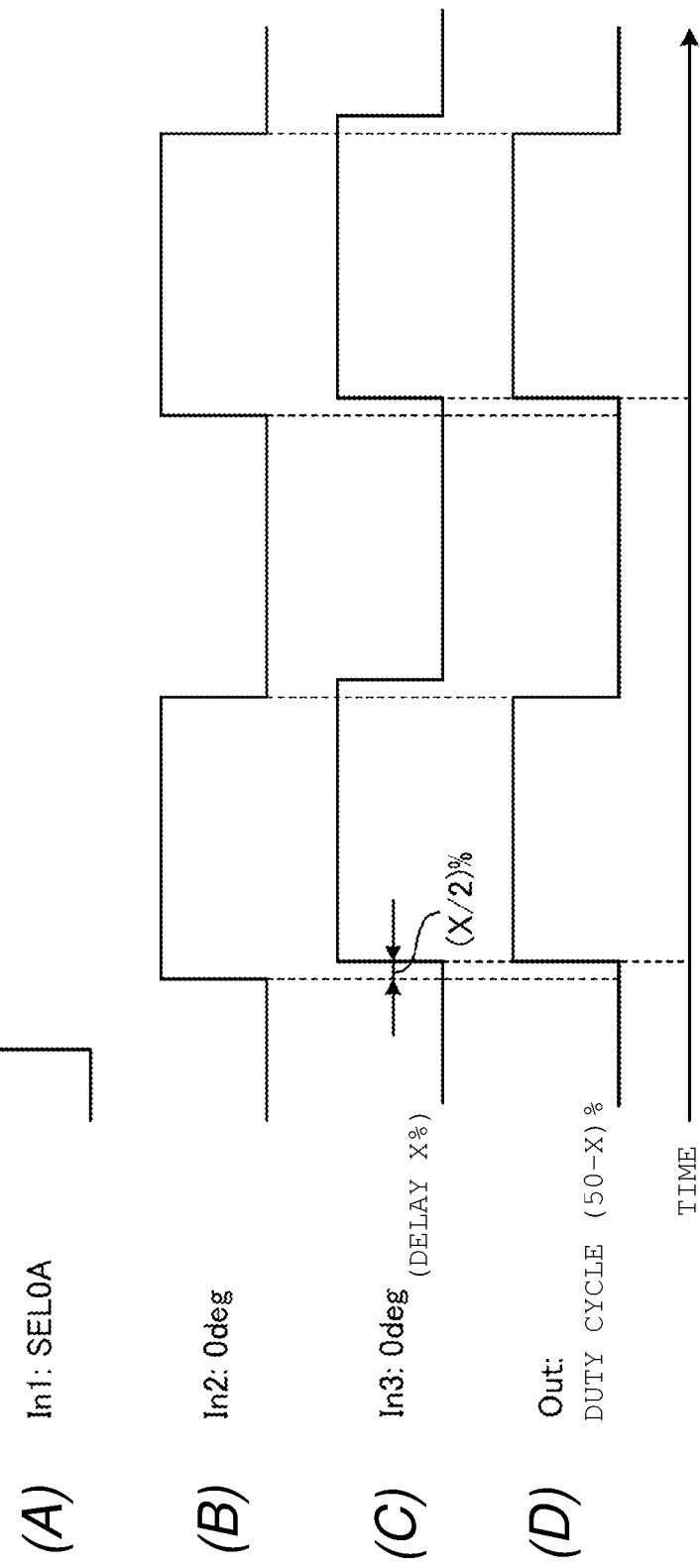

… (1)

SEMICONDUCTOR INTEGRATED CIRCUIT AND RECEIVING DEVICE

CROSS-REFERENCE TO RELATED APPLICATION

This application is based upon and claims the benefit of priority from Japanese Patent Application No. 2020-155725, filed on Sep. 16, 2020, the entire contents of which are incorporated herein by reference.

FIELD

Embodiments described herein relate generally to a semiconductor integrated circuit and a receiving device.

BACKGROUND

With recent increases in signal processing speed in data communications, high-speed and high-precision conversion are also in demand for analog-to-digital conversion circuits ("ADCs").

A time-interleaved ADC has been proposed for responding to this demand for higher conversion speeds and increased precision. The time-interleaved ADC uses a plurality of ADCs having the same structure and shifts operation timing of each of these ADC to effectively achieve a higher sample rate that cannot be provided by just one ADC operating alone. In a time-interleaved ADC, it is necessary to determine a duty cycle of the clock signal so as to avoid a tracking overlap. To address such an issue, a circuit using a variable capacitance element or a variable resistance element whose duty cycle can be adjusted may be used. However, the configuration of the circuit required for adjusting the clock signal duty cycle is complicated, which, in general, leads to a larger area being occupied by the circuit, and also the variation in the duty cycle due to process variation in making the complex circuit may be large.

BRIEF DESCRIPTION OF THE DRAWINGS

FIG. 10 is a schematic timing chart to explain processing of a fifth AND circuit.

DETAILED DESCRIPTION

Embodiments provide a semiconductor integrated circuit and a receiving device capable of reducing variations in the duty cycle with a simple circuit configuration.

In general, according to an embodiment, a semiconductor integrated circuit includes a first circuit and a second circuit. The first circuit is configured to divide a first pulse signal having a first duty cycle by N (where N is an integer of 2 or more), and output 2×N second pulse signals of which phases are different from each other. The first pulse signal is a pair of differential signals. The second circuit is configured to receive one or more selection signals and calculate a logical product of one of the one or more selection signals and two of the 2×N second pulse signals to generate a third pulse signal having a second duty cycle less than the first duty cycle.

Certain example embodiments will be described with reference to the drawings.

Figure 1:
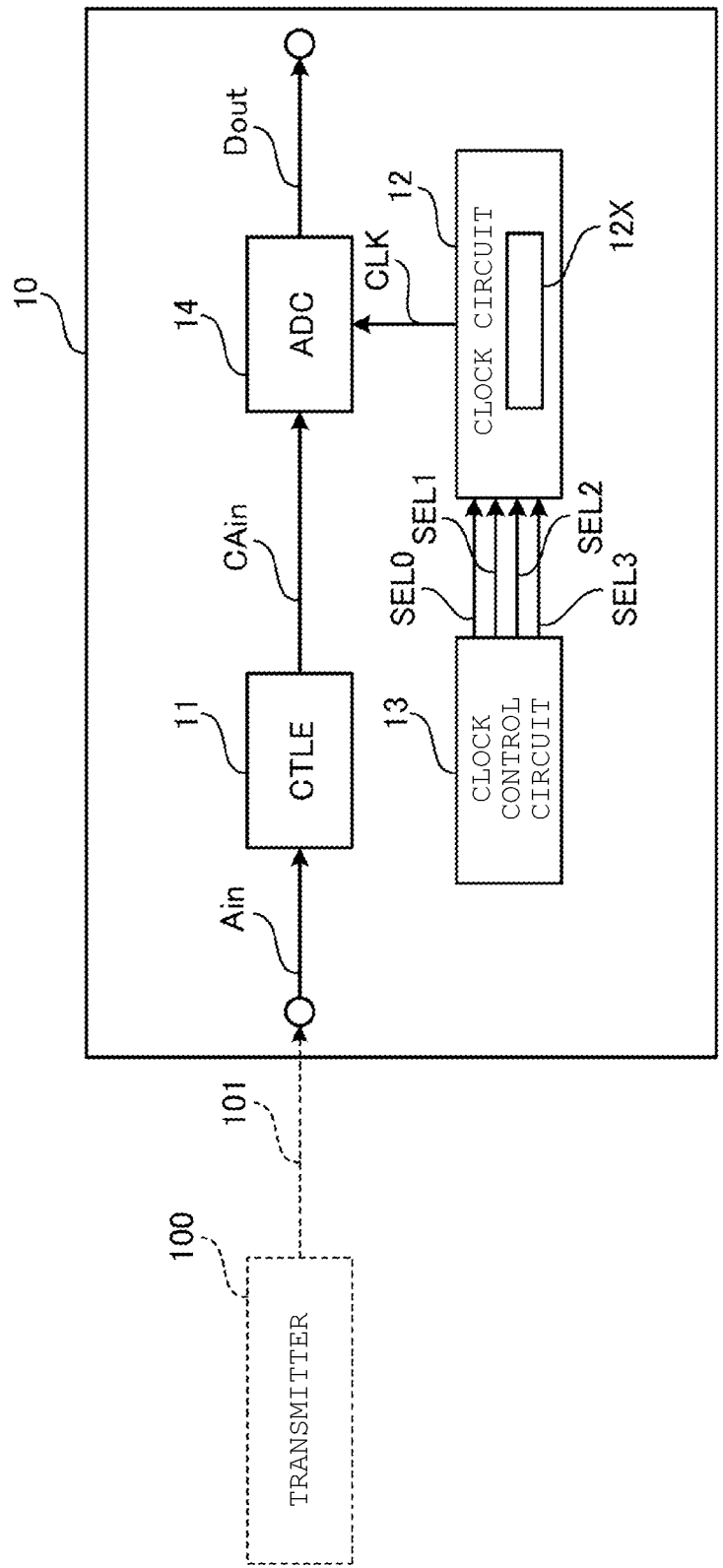
FIG. 1 is configuration block diagram illustrating a semiconductor integrated circuit including a time-interleaved ADC, according to an embodiment.

FIG. 1 is a block diagram showing a configuration of a receiving device 10 including a semiconductor integrated circuit 12X, according to an embodiment.

As shown in FIG. 1, the receiving device 10 includes a continuous time linear equalizer (CTLE) circuit 11, a clock circuit 12, a clock control circuit 13, and an analog-to-digital conversion circuit (ADC) 14. The semiconductor integrated circuit 12X according to the embodiment is configured as a part of the clock circuit 12.

The receiving device 10 can be connected to a transmitting device 100 ("transmitter") via a transmission line 101. A received signal Ain output from the transmitting device 100 passes through the transmission line 101, which may be wiring on a substrate, a copper wire cable, and a connector, and reaches the receiving device 10 with attenuation and reflection.

As a result, on the receiving device side, due to the influence of a certain amount of deterministic jitter (DJ) and the accompanying random jitter (RJ), the opening of the eye of the received signal Ain in a representative eye diagram gets narrower than that of the signal at the transmitting device 100.

A transmission line 101 composed of wiring on a substrate, a copper wire cable, or the like has a transmission loss characteristic, called insertion loss, in which a high-frequency component is more attenuated as compared with a low-frequency component. By being affected by the ISI jitter generated by this insertion loss, the eye opening of the received signal Ain is narrowed.

To address such an issue, the receiving device 10 includes the CTLE 11. The CTLE 11 compensates for the inverse characteristic of the insertion loss characteristic of the transmission line 101 of the received signal Ain with a high-pass filter. The CTLE 11 outputs a compensation signal CAin in which ISI jitter is reduced by this compensation.

The clock circuit 12 outputs a clock signal CLK based on the signal from the clock control circuit 13. The clock control circuit 13 outputs a selection signal for controlling the clock circuit 12. In this example, the clock control circuit 13 outputs a plurality of selection signals (first to fourth selection signals SEL0 to SEL3) to the clock circuit 12. Based on the clock signal CLK, the ADC 14 performs analog-to-digital conversion on the compensation signal CAin and outputs a digital output signal Dout.

Figure 2:
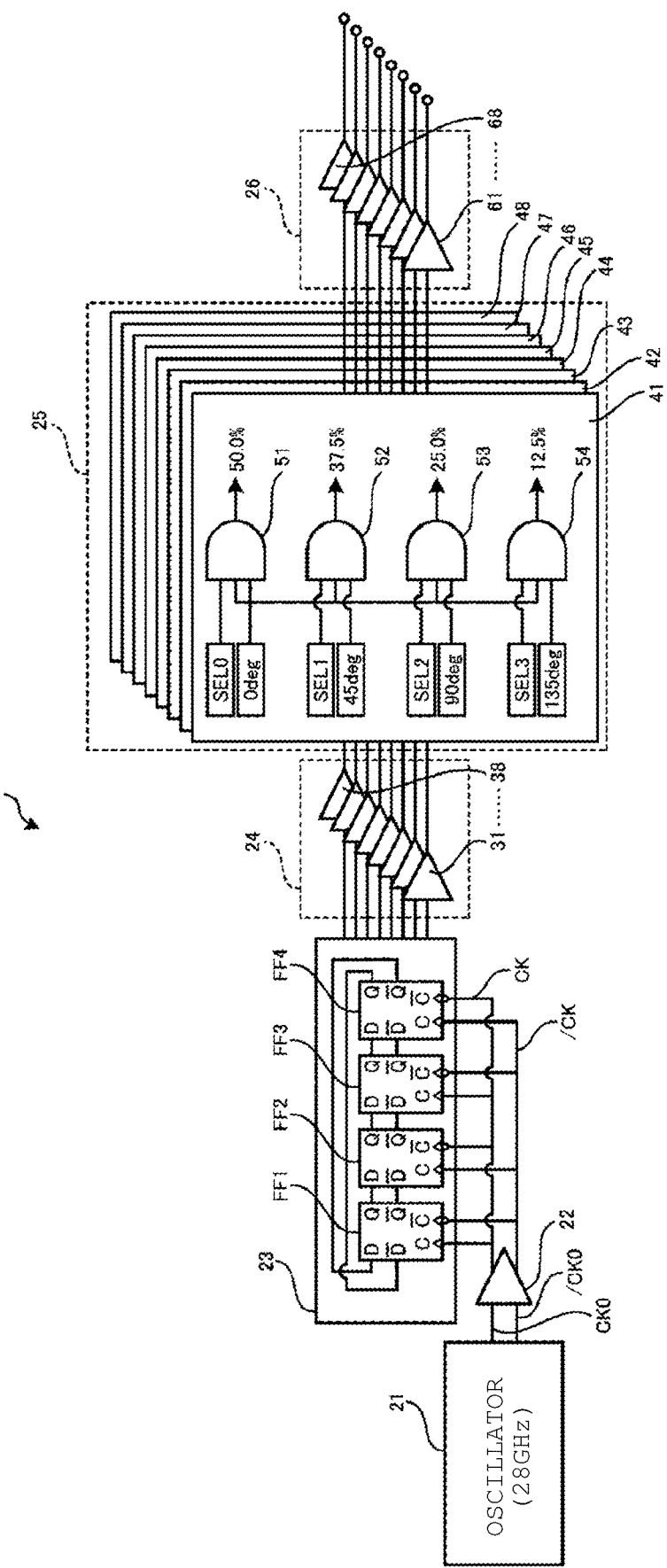
FIG. 2 is a schematic block diagram of a clock circuit.

FIG. 2 is a block diagram showing a configuration of the clock circuit.

It is desirable that the duty cycle of the clock signal CLK used in the time-interleaved ADC be adjustable so that tracking overlap can be avoided.

For example, the clock circuit 12 only needs to include a divide-by-N frequency divider, or a circuit corresponding thereto, that generates signals of 2×N phases with a duty cycle of 50%. In the following description, a clock circuit provided with a divide-by-4 frequency divider will be described as a non-limiting example.

The clock circuit 12 includes an oscillator 21, an input buffer 22, a divide-by-4 frequency divider 23, an intermediate buffer 24, a duty cycle setting circuit 25, and an output buffer 26.

The oscillator 21 is a circuit that generates and outputs an oscillation signal. The oscillator 21 outputs, for example, a differential oscillation signal having an oscillation frequency of 28 GHz as the clock signal CLK. The oscillation signal is a differential signal. That is, the oscillator 21 outputs a normal phase oscillation signal CK0 and a reversed-phase oscillation signal /CK0 as clock signals. The duty cycles of the two clock signals CK0 and /CK0 are both 50%.

The input buffer 22 performs waveform shaping of the clock signals CK0 and /CK0 output by the oscillator 21 and outputs the two shaped clock signals CK and /CK to the divide-by-4 frequency divider 23.

The divide-by-4 frequency divider 23 functions as an example of the first circuit and includes a first D flip-flop circuit FF1 to a fourth D flip-flop circuit FF4. The first D flip-flop circuit FF1 to the fourth D flip-flop circuit FF4 each have an input terminal D, an input terminal /D, an output terminal Q, an inverted output terminal /Q, a clock terminal C, and an inverted clock terminal /C.

The normal phase clock signal CK output by the input buffer 22 is input to each of the clock terminals C of the first D flip-flop circuit FF1 and the third D flip-flop circuit FF3.

Further, the reversed-phase clock signal /CK output by the input buffer 22 is input to each of the inverted clock terminals /C of the first D flip-flop circuit FF1 and the third D flip-flop circuit FF3.

The reversed-phase clock signal /CK output from the input buffer 22 is input to each of the clock terminals C of the second D flip-flop circuit FF2 and the fourth D flip-flop circuit FF4.

The normal phase clock signal CK output by the input buffer 22 is input to each of the inverted clock terminals /C of the second D flip-flop circuit FF2 and the fourth D flip-flop circuit FF4.

The output terminal Q of the first D flip-flop circuit FF1 is connected to the input terminal D of the second D flip-flop circuit FF2. Further, the inverted output terminal /Q of the first D flip-flop circuit is connected to the input terminal /D of the second D flip-flop circuit FF2.

The output terminal Q of the second D flip-flop circuit FF2 is connected to the input terminal D of the third D flip-flop circuit FF3. Further, the inverted output terminal /Q of the second D flip-flop circuit FF2 is connected to the input terminal /D of the third D flip-flop circuit FF3.

The output terminal Q of the third D flip-flop circuit FF3 is connected to the input terminal D of the fourth D flip-flop circuit FF4. Further, the inverted output terminal /Q of the third D flip-flop circuit FF3 is connected to the input terminal /D of the fourth D flip-flop circuit FF4.

The output terminal Q of the fourth D flip-flop circuit FF4 is connected to the input terminal /D of the first D flip-flop circuit FF1. The inverted output terminal /Q of the fourth D flip-flop circuit is connected to the input terminal D of the first D flip-flop circuit FF1.

In this configuration, the first D flip-flop circuit FF1 to the fourth D flip-flop circuit cooperate to function as a four-frequency-division circuit.

Further, eight-phase signals with each phase difference of 45° can be obtained from outputs of the first D flip-flop circuit FF1 to the fourth D flip-flop circuit FF4.

As a result, the divide-by-4 frequency divider 23 outputs the eight-phase clock signals having a duty cycle of 50% and different phases to each other to the intermediate buffer 24.

Figure 3:
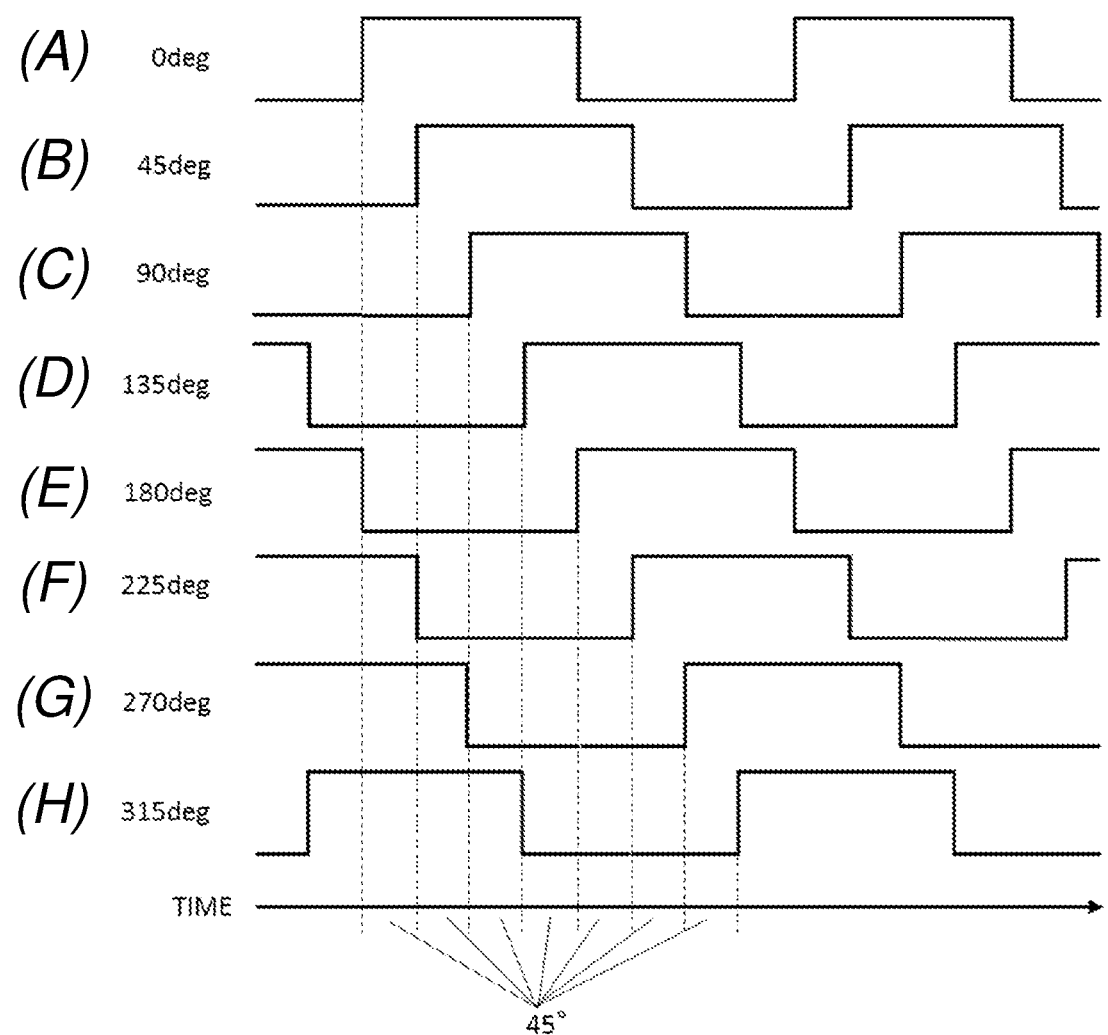
FIG. 3 is a schematic timing chart of eight-phase clock signals.

FIG. 3 is a schematic timing chart of eight-phase clock signals.

More specifically, the eight-phase clock signals include, with respect to a reference clock signal, a first divided clock signal 0 deg with a phase difference of 0° as shown in (A) of FIG. 3, a second divided clock signal 45 deg with a phase difference of 45° as shown in (B) of FIG. 3, a third divided clock signal 90 deg with a phase difference of 90° as shown in (C) of FIG. 3, and a fourth divided clock signal 135 deg with a phase difference of 135° as shown in (D) of FIG. 3, respectively.

Further, the eight-phase clock signals include, with respect to the reference clock signal, a fifth divided clock signal 180 deg with a phase difference of 180° as shown in (E) of FIG. 3, a sixth divided clock signal 225 deg with a phase difference of 225° as shown in (F) of FIG. 3, a seventh divided clock signal 270 deg with a phase difference of 270° as shown in (G) of FIG. 3, and an eighth divided clock signal 315 deg with a phase difference of 315° as shown in (H) of FIG. 3, respectively.

In the present embodiment, frequencies of the first divided clock signal 0 deg to the eighth divided clock signal 315 deg are 7 GHz obtained by dividing 28 GHz by four.

The intermediate buffer 24 shown in FIG. 2 includes eight intermediate buffer units 31 to 38. In the intermediate buffer 24, each of the eight intermediate buffer units 31 to 38 receives any one of the first to eighth divided clock signals 0 deg to 315 deg of the eight phases output by the divide-by-4 frequency divider 23, which are different from each other. Each of the eight intermediate buffer units 31 to 38 outputs buffered first to eighth divided clock signals 0 deg to 315 deg of the eight phases, respectively.

The duty cycle setting circuit 25 includes eight units of the first to eighth duty cycle setting units 41 to 48.

In this case, the first duty cycle setting unit 41 corresponds to the first divided clock signal 0 deg, the second divided clock signal 45 deg, the third divided clock signal 90 deg, and the fourth divided clock signal 135 deg.

The second duty cycle setting unit 42 corresponds to the second divided clock signal 45 deg, the third divided clock signal 90 deg, the fourth divided clock signal 135 deg, and the fifth divided clock signal 180 deg.

The third duty cycle setting unit 43 corresponds to the third divided clock signal 90 deg, the fourth divided clock signal 135 deg, the fifth divided clock signal 180 deg, and the sixth divided clock signal 225 deg.

The fourth duty cycle setting unit 44 corresponds to the fourth divided clock signal 135 deg, the fifth divided clock signal 180 deg, the sixth divided clock signal 225 deg, and the seventh divided clock signal 270 deg.

The fifth duty cycle setting unit 45 corresponds to the fifth divided clock signal 180 deg, the sixth divided clock signal 225 deg, the seventh divided clock signal 270 deg, and the eighth divided clock signal 315 deg.

The sixth duty cycle setting unit 46 corresponds to the sixth divided clock signal 225 deg, the seventh divided clock signal 270 deg, the eighth divided clock signal 315 deg, and the first divided clock signal 0 deg.

The seventh duty cycle setting unit 47 corresponds to the seventh divided clock signal 270 deg, the eighth divided clock signal 315 deg, the first divided clock signal 0 deg, and the second divided clock signal 45 deg.

The eighth duty cycle setting unit 48 corresponds to the eighth divided clock signal 315 deg, the first divided clock signal 0 deg, the second divided clock signal 45 deg, and the third divided clock signal 90 deg.

The first to eighth duty cycle setting units 41 to 48 each receive selection signals SEL0 to SEL3 output by the clock control circuit 13.

The first to eighth duty cycle setting units 41 to 48 each also receive buffered eight-phase clock signals from the intermediate buffer 24.

The first to eighth duty cycle setting units 41 to 48 respectively generate a signal with a changed duty cycle based on the states of the corresponding divided clock signals among the first to eighth divided clock signals 0 deg to 315 deg and the selection signals SEL0 to SEL3.

As a result, the duty cycle setting circuit 25 outputs a plurality of signals with changed duty cycles from the first to eighth duty cycle setting units 41 to 48. The plurality of signals with changed duty cycles are eight-phase clock signals with changed duty cycles and having phases different from each other.

The output buffer 26 includes eight output buffer units 61 to 68. The eight output buffer units 61 to 68 correspond to the first duty cycle setting unit 41 to the eighth duty cycle setting unit 48, respectively.

In the output buffer 26, each of the eight output buffer units 61 to 68 receives each of the eight-phase clock signals output by the duty cycle setting circuit 25. Each of the eight output buffer units 61 to 68 outputs one of buffered eight-phase clock signals.

As described above, the duty cycle setting circuit 25 includes the first to eighth duty cycle setting units 41 to 48. The first to eighth duty cycle setting units 41 to 48 each have the same individual configuration. Here, the first duty cycle setting unit 41 will be described as a representative example.

As shown in FIG. 2, the first duty cycle setting unit 41 includes first to fourth AND circuits 51 to 54.

The first to fourth AND circuits 51 to 54 each include a first input terminal In1, a second input terminal In2, a third input terminal In3, and an output terminal out. The first to fourth AND circuits 51 to 54 each have the same configuration.

The first to fourth AND circuits 51 to 54 calculate the logical product of the signals input to each of the first input terminal In1, the second input terminal In2, and the third input terminals In3 and outputs the calculated result from the output terminal out.

The operations of the first to eighth duty cycle setting units 41 to 48 will be further described below.

First, the operation of the first duty cycle setting unit 41 will be described.

Figure 4:
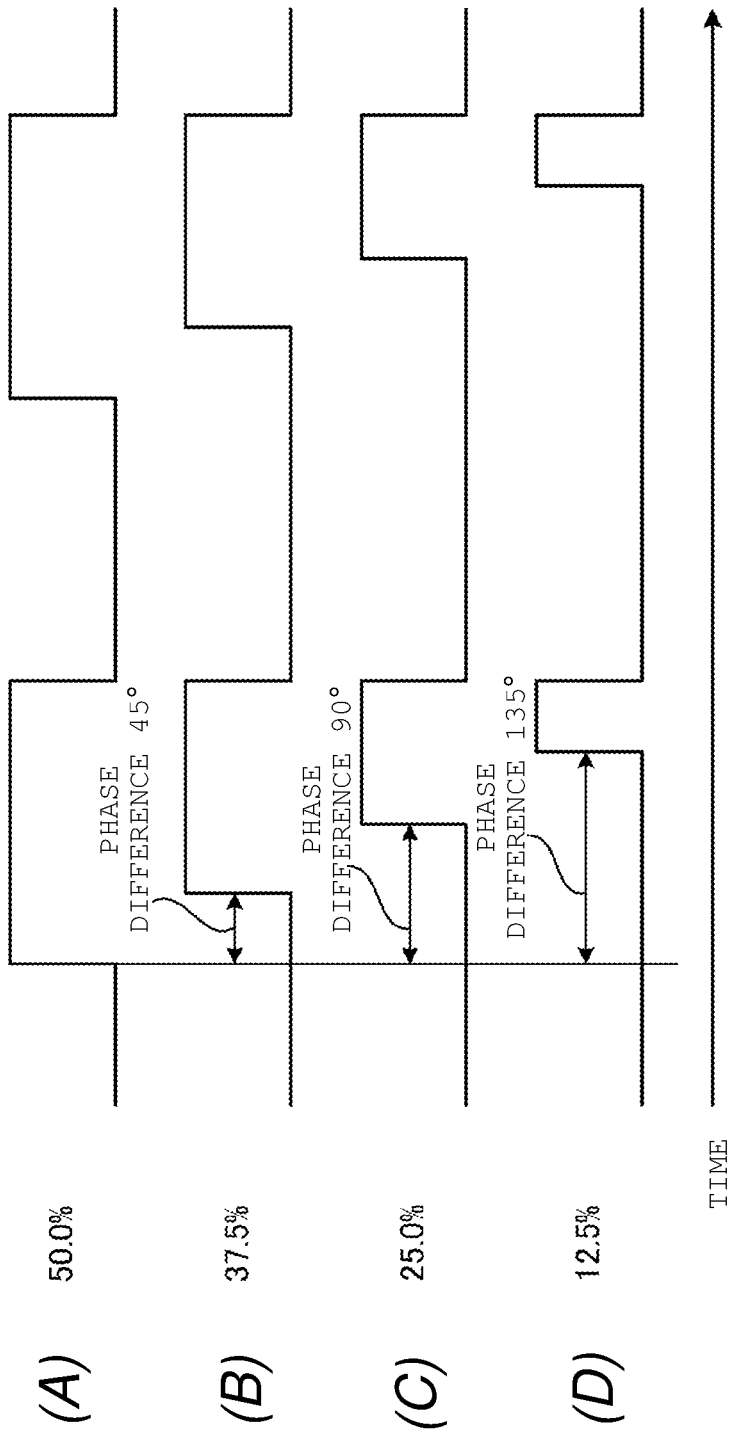
FIG. 4 is a schematic timing chart of clock signals to explain a duty cycle thereof.

FIG. 4 is a schematic timing chart of the clock signals to explain the duty cycle thereof.

Figure 5:
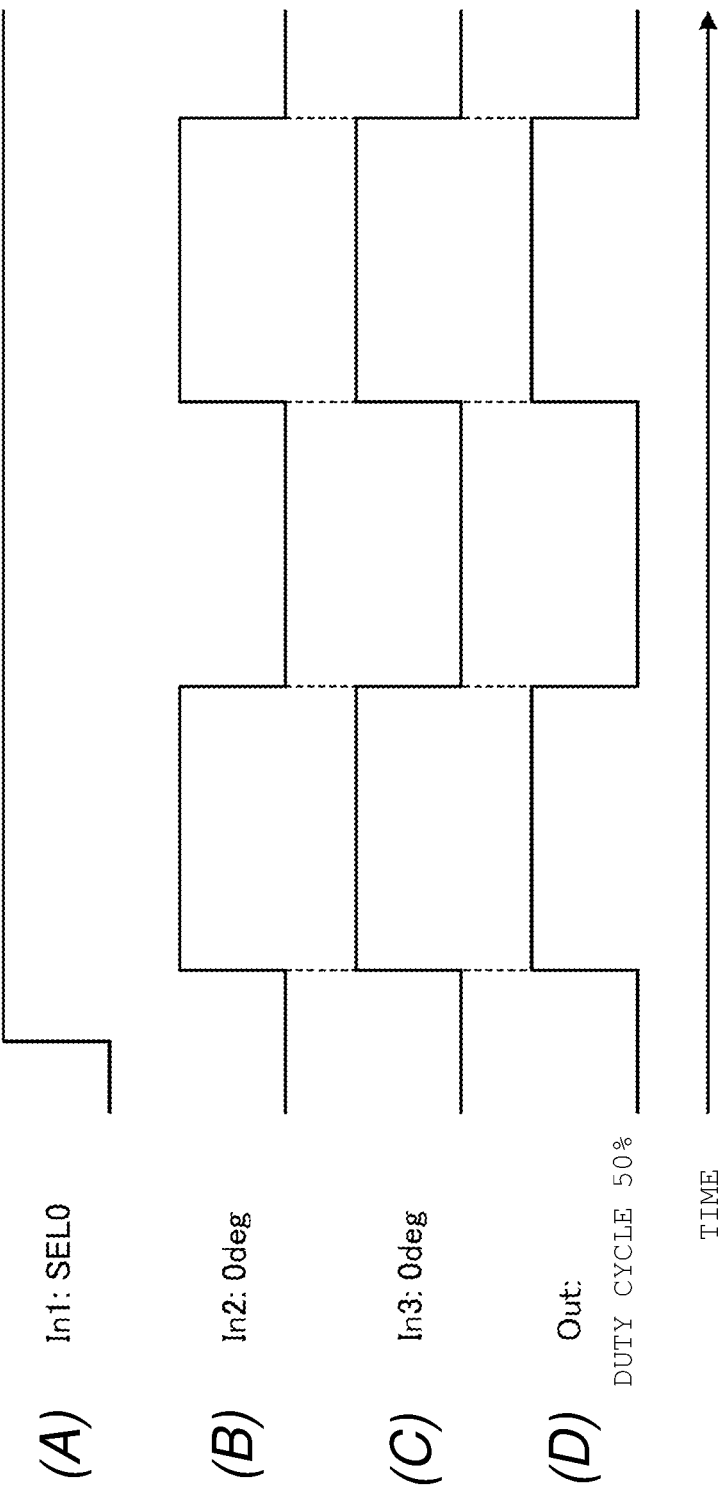
FIG. 5 is a schematic timing chart to explain processing of a first AND circuit.

FIG. 5 is schematic timing chart to explain the processing of the first AND circuit.

As shown in FIG. 2, in the first AND circuit 51 of the first duty cycle setting unit 41, the first selection signal SEL0 shown in (A) of FIG. 5 is input to the first input terminal In1, the first divided clock signal 0 deg shown in (B) of FIG. 5 is input to the second input terminal In2, and the first divided clock signal 0 deg shown in (C) of FIG. 5 is input to the third input terminal In3.

As a result, the first AND circuit 51 of the first duty cycle setting unit 41 calculates the logical product of the input first selection signal SEL0 and first divided clock signal 0 deg, and outputs the calculation result shown in (D) of FIG. 5 to the output terminal out.

That is, when the first selection signal SEL0 is in the selected state, the first AND circuit 51 has a duty cycle of 50% as shown in (A) of FIG. 4 and (D) of FIG. 5 and outputs a clock signal with a phase difference of 0° for the first divided clock signal 0 deg that is the reference clock signal. Here, the first selection signal SEL0 is in the selected state at the logic level H.

Figure 6:
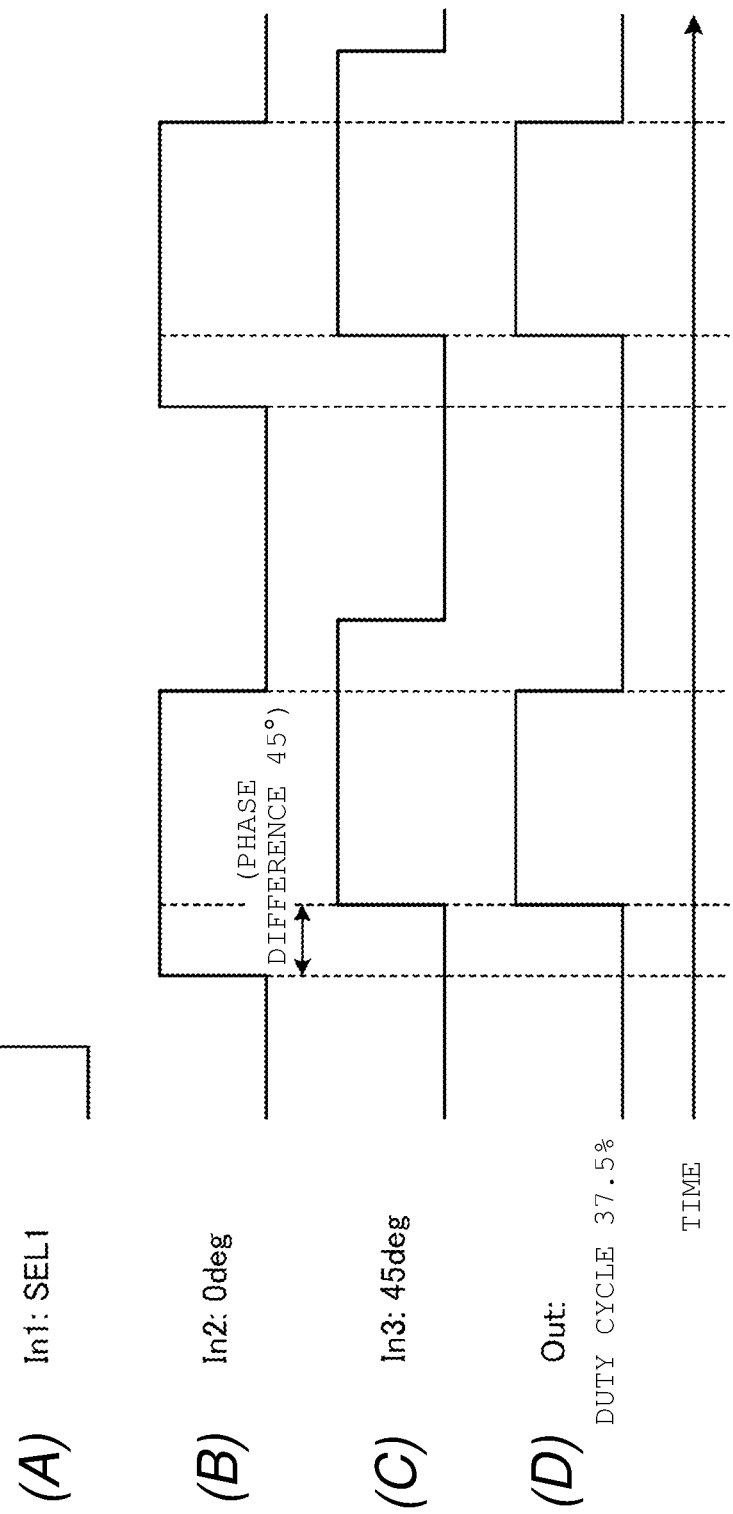
FIG. 6 is a schematic timing chart to explain processing of a second AND circuit.

FIG. 6 is a schematic timing chart to explain the processing of the second AND circuit.

Further, in the second AND circuit 52 of the first duty cycle setting unit 41, the second selection signal SEL1 shown in (A) of FIG. 6 is input to the first input terminal In1, the first divided clock signal 0 deg shown in (B) of FIG. 6 is input to the second input terminal In2, and the second divided clock signal 45 deg shown in (C) of FIG. 6 is input to the third input terminal In3. The second AND circuit 52 calculates the logical product of the input second selection signal SEL1, first divided clock signal 0 deg, and second divided clock signal 45 deg, and outputs the calculation result shown in (D) of FIG. 6 to the output terminal out.

That is, when the second selection signal SEL1 is in the selected state, the second AND circuit 52 outputs a clock signal in which the duty cycle is 37.5% as shown in (B) of FIG. 4 and (D) of FIG. 6, the timing of a falling edge is the same as the timing of the falling edge of the first divided clock signal 0 deg, and the timing of the rising edge is delayed from the timing of the rising edge of the first divided clock signal 0 deg by 45°. Here, the second selection signal SEL1 is in the selected state at the logic level H.

Figure 7:
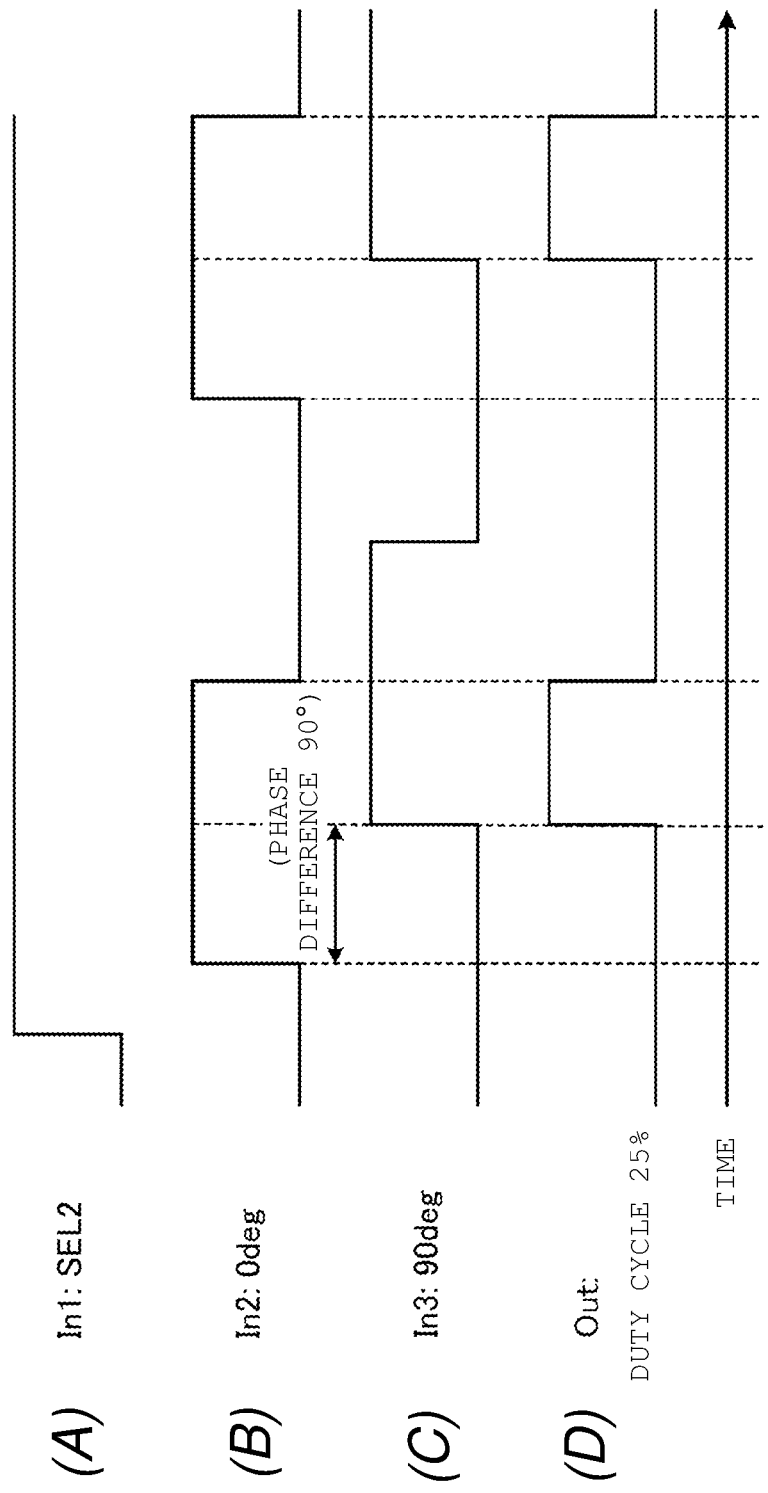
FIG. 7 is a schematic timing chart to explain processing of a third AND circuit.

FIG. 7 is a schematic timing chart to explain the processing of the third AND circuit.

Further, in the third AND circuit 53 of the first duty cycle setting unit 41, the third selection signal SEL2 shown in (A) of FIG. 7 is input to the first input terminal In1, the first divided clock signal 0 deg shown in (B) of FIG. 7 is input to the second input terminal Int, and the third divided clock signal 90 deg shown in (C) of FIG. 7 is input to the third input terminal In3. The third AND circuit 53 calculates the logical product of the input third selection signal SEL2, first divided clock signal 0 deg, and third divided clock signal 90 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4 and (D) of FIG. 7, the timing of the falling edge is the same as the timing of the falling edge of the first divided clock signal 0 deg, and the timing of the rising edge is delayed from the timing of the rising edge of the first divided clock signal 0 deg by 90°. Here, the third selection signal SEL2 is in the selected state at the logic level H.

Figure 8:
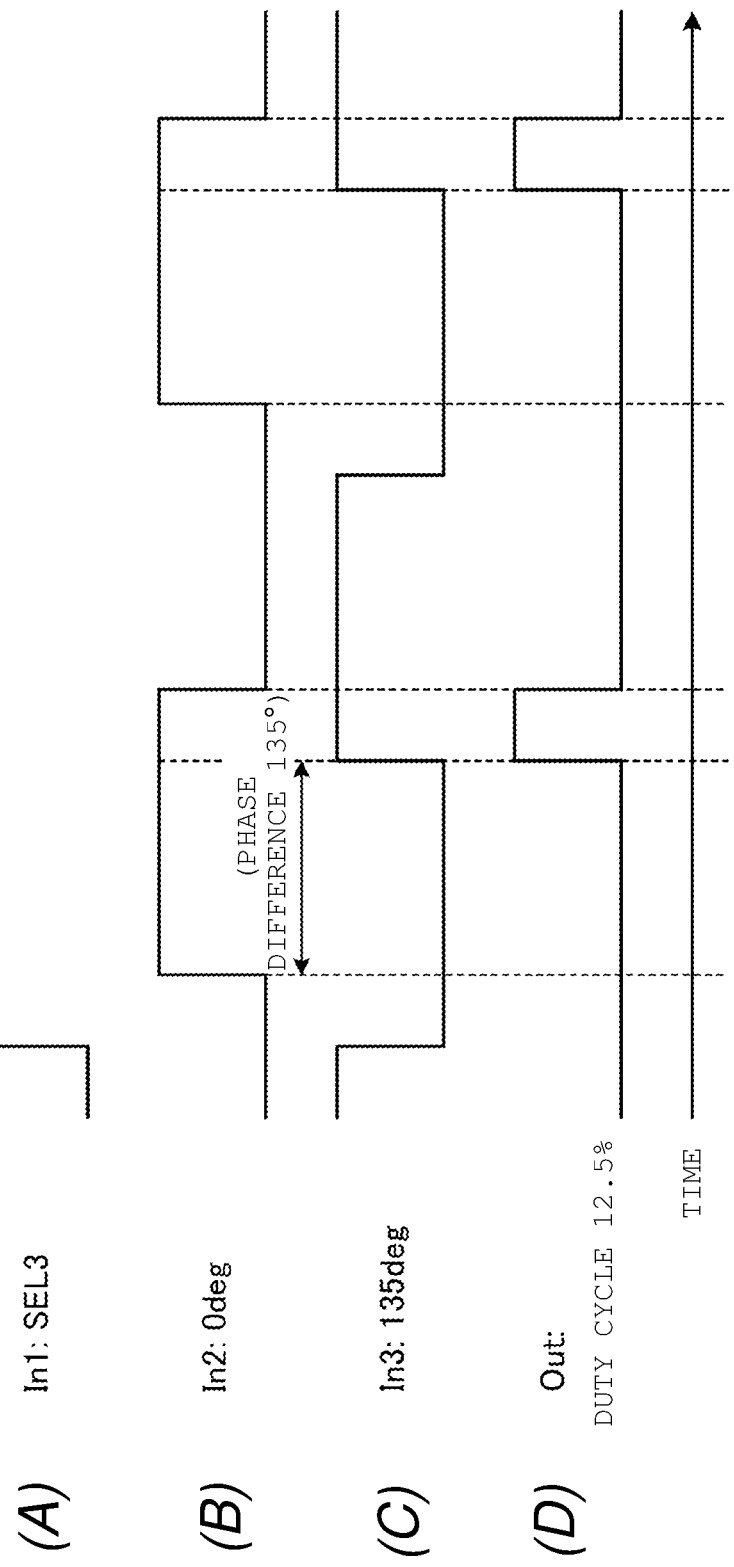
FIG. 8 is a schematic timing chart to explain processing of a fourth AND circuit.

FIG. 8 is a schematic timing chart to explain the processing of the fourth AND circuit.

Further, in the fourth AND circuit 54 of the first duty cycle setting unit 41, the fourth selection signal SEL3 shown in (A) of FIG. 8 is input to the first input terminal In1, the first divided clock signal 0 deg shown in (B) of FIG. 8 is input to the second input terminal Int, and the fourth divided clock signal 135 deg shown in (C) of FIG. 8 is input to the third input terminal In3. The fourth AND circuit 54 calculates the logical product of the input fourth selection signal SEL3, first divided clock signal 0 deg, and fourth divided clock signal 135 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4 and (D) of FIG. 8, the timing of the falling edge is the same as the timing of the falling edge of the first divided clock signal 0 deg, and the timing of the rising edge is delayed from the timing of the rising edge of the first divided clock signal 0 deg by 135°. Here, the fourth selection signal SEL3 is in the selected state at the logic level H.

In the above configuration, the first AND circuit 51 to the fourth AND circuit 54 each constitute an example of the second circuit.

Further, one of the first selection signal SEL0 to the fourth selection signal SEL3 is exclusively selected. That is, when the first selection signal SEL0 is in the selected state, a clock signal having a duty cycle of 50% as shown in (A) of FIG. 4 and a phase difference of 0° is output from the first duty cycle setting unit 41. Further, a clock signal corresponding to this signal is output via the first output buffer unit 61 corresponding to the first duty cycle setting unit 41.

Similarly, when the second selection signal SEL1 is in the selected state, a clock signal having a duty cycle of 37.5% as shown in (B) of FIG. 4 and a phase difference of 45° is output from the first duty cycle setting unit 41. Further, a clock signal corresponding to this signal is output via the first output buffer unit 61 corresponding to the first duty cycle setting unit 41.

When the third selection signal SEL2 is in the selected state, a clock signal having a duty cycle of 25.0% as shown in (C) of FIG. 4 and a phase difference of 90° is output from the first duty cycle setting unit 41. Further, a clock signal corresponding to this signal is output via the first output buffer unit 61 corresponding to the first duty cycle setting unit 41.

When the fourth selection signal SEL3 is in the selected state, a clock signal having a duty cycle of 12.5% as shown in (D) of FIG. 4 and a phase difference of 135° is output from the first duty cycle setting unit 41. Further, a clock signal corresponding to this signal is output via the first output buffer unit 61 corresponding to the first duty cycle setting unit 41.

The second duty cycle setting unit 42 to the eighth duty cycle setting unit 48 have the same configuration as the first duty cycle setting unit 41. In the following description, the configurations in the second duty cycle setting unit 42 to the eighth duty cycle setting unit 48 that is the same as that of the first duty cycle setting unit 41 will be made with reference to the same reference numerals as those of the duty cycle setting unit 41.

Next, the operation of the second duty cycle setting unit 42 will be further described with reference to FIGS. 2 to 8.

Similarly to the first duty cycle setting unit 41, the first selection signal SEL0 shown in (A) of FIG. 5 is input to the first input terminal In1 in the first AND circuit 51 of the second duty cycle setting unit 42, the second divided clock signal 45 deg shown in (B) of FIG. 3 is input to the second input terminal In2, and the second divided clock signal 45 deg shown in (B) of FIG. 3 is input to the third input terminal In3.

As a result, the first AND circuit 51 of the second duty cycle setting unit 42 calculates the logical product of the input first selection signal SEL0 and second divided clock signal 45 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the second divided clock signal 45 deg. Here, the first selection signal SEL0 is in the selected state at the logic level H.

Further, in the second AND circuit 52 of the second duty cycle setting unit 42, the second selection signal SEL1 shown in (A) of FIG. 6 is input to the first input terminal In1, and the second divided clock signal 45 deg shown in (B) of FIG. 3 is input to the second input terminal In2, and the third divided clock signal 90 deg shown in (C) of FIG. 3 is input to the third input terminal In3. The second AND circuit 52 calculates the logical product of the input second selection signal SEL1, second divided clock signal 45 deg, and third divided clock signal 90 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the second divided clock signal 45 deg, and the timing of the rising edge is delayed from the timing of the rising edge of the second divided clock signal 45 deg by 45°. Here, the second selection signal SEL1 is in the selected state at the logic level H.

Further, in the third AND circuit 53 of the second duty cycle setting unit 42, the third selection signal SEL2 shown in (A) of FIG. 7 is input to the first input terminal In1, the second divided clock signal 45 deg shown in (B) of FIG. 3 is input to the second input terminal In2, and the fourth divided clock signal 135 deg shown in (D) of FIG. 3 is input to the third input terminal In3. The third AND circuit 53 calculates the logical product of the input third selection signal SEL2, second divided clock signal 45 deg, and fourth divided clock signal 135 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the second divided clock signal 45 deg, and the timing of the rising edge is delayed from the timing of the rising edge of the second divided clock signal 45 deg by 90°. Here, the third selection signal SEL2 is in the selected state at the logic level H.

Further, in the fourth AND circuit 54 of the second duty cycle setting unit 42, the fourth selection signal SEL3 shown in (A) of FIG. 8 is input to the first input terminal In1, the second divided clock signal 45 deg shown in (B) of FIG. 3 is input to the second input terminal In2, and the fifth divided clock signal 180 deg shown in (E) of FIG. 3 is input to the third input terminal In3. The fourth AND circuit 54 calculates the logical product of the input fourth selection signal SEL3, second divided clock signal 45 deg, and fifth divided clock signal 180 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the second divided clock signal 45 deg, and the timing of the rising edge is delayed from the timing of the rising edge of the second divided clock signal 45 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 45° (=45°+0°) is output from the second duty cycle setting unit 42. Further, a clock signal corresponding to this signal is output via the second output buffer unit 62 corresponding to the second duty cycle setting unit 42.

Similarly, when the second selection signal SEL1 is in the selected state, a clock signal having a duty cycle of 37.5% as shown in (B) of FIG. 4 and a phase difference of 90° (=45°+45°) is output from the second duty cycle setting unit 42. Further, a clock signal corresponding to this signal is output via the second output buffer unit 62 corresponding to the second duty cycle setting unit 42.

When the third selection signal SEL2 is in the selected state, a clock signal having a duty cycle of 25.0% as shown in (C) of FIG. 4 and a phase difference of 135° (=45°+90°) is output from the second duty cycle setting unit 42. Further, a clock signal corresponding to this signal is output via the second output buffer unit 62 corresponding to the second duty cycle setting unit 42.

When the fourth selection signal SEL3 is in the selected state, a clock signal having a duty cycle of 12.5% as shown in (D) of FIG. 4 and a phase difference of 180° (=45°+135°) is output from the second duty cycle setting unit 42. Further, a clock signal corresponding to this signal is output via the second output buffer unit 62 corresponding to the second duty cycle setting unit 42.

Next, the operation of the third duty cycle setting unit 43 will be further described with reference to FIGS. 2 to 8.

Similarly to the first duty cycle setting unit 41, the first selection signal SEL0 shown in (A) of FIG. 5 is input to the first input terminal In1 in the first AND circuit 51 of the third duty cycle setting unit 43, the third divided clock signal 90 deg shown in (C) of FIG. 3 is input to the second input terminal Int, and the third divided clock signal 90 deg shown in (C) of FIG. 3 is input to the third input terminal In3.

As a result, the first AND circuit 51 of the third duty cycle setting unit 43 calculates the logical product of the input first selection signal SEL0 and third divided clock signal 90 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the third divided clock signal 90 deg. Here, the first selection signal SEL0 is in the selected state at the logic level H.

Further, in the second AND circuit 52 of the third duty cycle setting unit 43, the second selection signal SEL1 shown in (A) of FIG. 6 is input to the first input terminal In1, and the third divided clock signal 90 deg shown in (C) of FIG. 3 is input to the second input terminal In2, and the fourth divided clock signal 135 deg shown in (D) of FIG. 3 is input to the third input terminal In3. The second AND circuit 52 calculates the logical product of the input second selection signal SEL1, third divided clock signal 90 deg, and fourth divided clock signal 135 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the third divided clock signal 90 deg, and the timing of the rising edge is delayed from the timing of the rising edge of the third divided clock signal 90 deg by 45°. Here, the second selection signal SEL1 is in the selected state at the logic level H.

Further, in the third AND circuit 53 of the third duty cycle setting unit 43, the third selection signal SEL2 shown in (A) of FIG. 7 is input to the first input terminal In1, the third divided clock signal 90 deg shown in (C) of FIG. 3 is input to the second input terminal In2, and the fifth divided clock signal 180 deg shown in (E) of FIG. 3 is input to the third input terminal In3. The third AND circuit 53 calculates the logical product of the input third selection signal SEL2, third divided clock signal 90 deg, and fifth divided clock signal 180 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the third divided clock signal 90 deg, and the timing of the rising edge is delayed from the timing of the rising edge of the third divided clock signal 90 deg by 90°. Here, the third selection signal SEL2 is in the selected state at the logic level H.

Further, in the fourth AND circuit 54 of the third duty cycle setting unit 43, the fourth selection signal SEL3 shown in (A) of FIG. 8 is input to the first input terminal Int, the third divided clock signal 90 deg shown in (C) of FIG. 3 is input to the second input terminal Int, and the sixth divided clock signal 225 deg shown in (F) of FIG. 3 is input to the third input terminal In3. The fourth AND circuit 54 calculates the logical product of the input fourth selection signal SEL3, third divided clock signal 90 deg, and sixth divided clock signal 225 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the third divided clock signal 90 deg, and the timing of the rising edge is delayed from the timing of the rising edge of the third divided clock signal 90 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 90° (=90°+0°) is output from the third duty cycle setting unit 43. Further, a clock signal corresponding to this signal is output via the third output buffer unit 63 corresponding to the third duty cycle setting unit 43.

Similarly, when the second selection signal SEL1 is in the selected state, a clock signal having a duty cycle of 37.5% as shown in (B) of FIG. 4 and a phase difference of 135° (=90°+45°) is output from the third duty cycle setting unit 43. Further, a clock signal corresponding to this signal is output via the third output buffer unit 63 corresponding to the third duty cycle setting unit 43.

When the third selection signal SEL2 is in the selected state, a clock signal having a duty cycle of 25.0% as shown in (C) of FIG. 4 and a phase difference of 180° (=90°+90°) is output from the third duty cycle setting unit 43. Further, a clock signal corresponding to this signal is output via the third output buffer unit 63 corresponding to the third duty cycle setting unit 43.

When the fourth selection signal SEL3 is in the selected state, a clock signal having a duty cycle of 12.5% as shown in (D) of FIG. 4 and a phase difference of 225° (=90°+135°) is output from the third duty cycle setting unit 43. Further, a clock signal corresponding to this signal is output via the third output buffer unit 63 corresponding to the third duty cycle setting unit 43.

Next, the operation of the fourth duty cycle setting unit 44 will be further described with reference to FIGS. 2 to 8.

Similarly to the first duty cycle setting unit 41, the first selection signal SEL0 shown in (A) of FIG. 5 is input to the first input terminal Int in the first AND circuit 51 of the fourth duty cycle setting unit 44, the fourth divided clock signal 135 deg shown in (D) of FIG. 3 is input to the second input terminal Int, and the fourth divided clock signal 135 deg shown in (D) of FIG. 3 is input to the third input terminal In3.

As a result, the first AND circuit 51 of the fourth duty cycle setting unit 44 calculates the logical product of the input first selection signal SEL0 and fourth divided clock signal 135 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the fourth divided clock signal 135 deg. Here, the first selection signal SEL0 is in the selected state at the logic level H.

Further, in the second AND circuit 52 of the fourth duty cycle setting unit 44, the second selection signal SEL1 shown in (A) of FIG. 6 is input to the first input terminal Int, and the fourth divided clock signal 135 deg shown in (D) of FIG. 3 is input to the second input terminal Int, and the fifth divided clock signal 180 deg shown in (E) of FIG. 3 is input to the third input terminal In3. The second AND circuit 52 calculates the logical product of the input second selection signal SEL1, fourth divided clock signal 135 deg, and fifth divided clock signal 180 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the fourth divided clock signal 135 deg, and the timing of the rising edge is delayed from the timing of the rising edge of the fourth divided clock signal 135 deg by 45°. Here, the second selection signal SEL1 is in the selected state at the logic level H.

Further, in the third AND circuit 53 of the fourth duty cycle setting unit 44, the third selection signal SEL2 shown in (A) of FIG. 7 is input to the first input terminal In1, the fourth divided clock signal 135 deg shown in (D) of FIG. 3 is input to the second input terminal Int, and the sixth divided clock signal 225 deg shown in (F) of FIG. 3 is input to the third input terminal In3. The third AND circuit calculates the logical product of the input third selection signal SEL2, the fourth divided clock signal 135 deg, and the sixth divided clock signal 225 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the fourth divided clock signal 135 deg, and the timing of the rising edge is delayed from the timing of the rising edge of the fourth divided clock signal 135 deg by 90°. Here, the third selection signal SEL2 is in the selected state at the logic level H.

Further, in the fourth AND circuit 54 of the fourth duty cycle setting unit 44, the fourth selection signal SEL3 shown in (A) of FIG. 8 is input to the first input terminal In1, the fourth divided clock signal 135 deg shown in (D) of FIG. 3 is input to the second input terminal Int, and the seventh divided clock signal 270 deg shown in (G) of FIG. 3 is input to the third input terminal In3. The fourth AND circuit 54 calculates the logical product of the input fourth selection signal SEL3, fourth divided clock signal 135 deg, and seventh divided clock signal 270 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the fourth divided clock signal 135 deg, and the timing of the rising edge is delayed from the timing of the rising edge of the fourth divided clock signal 135 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 135° (=135°+) 0° is output from the fourth duty cycle setting unit 44. Further, a clock signal corresponding to this signal is output via the fourth output buffer unit 64 corresponding to the fourth duty cycle setting unit 44.

Similarly, when the second selection signal SEL1 is in the selected state, a clock signal having a duty cycle of 37.5% as shown in (B) of FIG. 4 and a phase difference of 180° (=135°+45°) is output from the fourth duty cycle setting unit 44. Further, a clock signal corresponding to this signal is output via the fourth output buffer unit 64 corresponding to the fourth duty cycle setting unit 44.

When the third selection signal SEL2 is in the selected state, a clock signal having a duty cycle of 25.0% as shown in (C) of FIG. 4 and a phase difference of 225° (=135°+90°) is output from the fourth duty cycle setting unit 44. Further, a clock signal corresponding to this signal is output via the fourth output buffer unit 64 corresponding to the fourth duty cycle setting unit 44.

When the fourth selection signal SEL3 is in the selected state, a clock signal having a duty cycle of 12.5% as shown in (D) of FIG. 4 and a phase difference of 270° (=135°+135°) is output from the fourth duty cycle setting unit 44. Further, a clock signal corresponding to this signal is output via the fourth output buffer unit 64 corresponding to the fourth duty cycle setting unit 44.

Next, the operation of the fifth duty cycle setting unit 45 will be further described with reference to FIGS. 2 to 8.

Similarly to the first duty cycle setting unit 41, the first selection signal SEL0 shown in (A) of FIG. 5 is input to the first input terminal Int in the first AND circuit 51 of the fifth duty cycle setting unit 45, the fifth divided clock signal 180 deg shown in (E) of FIG. 3 is input to the second input terminal Int, and the fifth divided clock signal 180 deg shown in (E) of FIG. 3 is input to the third input terminal In3.

As a result, the first AND circuit 51 of the fifth duty cycle setting unit 45 calculates the logical product of the input first selection signal SEL0 and fifth divided clock signal 180 deg and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the fifth divided clock signal 180 deg. Here, the first selection signal SEL0 is in the selected state at the logic level H.

Further, in the second AND circuit 52 of the fifth duty cycle setting unit 45, the second selection signal SEL1 shown in (A) of FIG. 6 is input to the first input terminal Int, and the fifth divided clock signal 180 deg shown in (E) of FIG. 3 is input to the second input terminal Int, and the sixth divided clock signal 225 deg shown in (F) of FIG. 3 is input to the third input terminal In3. The second AND circuit 52 calculates the logical product of the input second selection signal SEL1, fifth divided clock signal 180 deg, and sixth divided clock signal 225 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the fifth divided clock signal 180 deg, and the timing of the rising edge is delayed from the timing of the rising edge of the fifth divided clock signal 180 deg by 45°. Here, the second selection signal SEL1 is in the selected state at the logic level H.

Further, in the third AND circuit 53 of the fifth duty cycle setting unit 45, the third selection signal SEL2 shown in (A) of FIG. 7 is input to the first input terminal Int, the fifth divided clock signal 180 deg shown in (E) of FIG. 3 is input to the second input terminal Int, and the seventh divided clock signal 270 deg shown in (G) of FIG. 3 is input to the third input terminal In3. The third AND circuit 53 calculates the logical product of the input third selection signal SEL2, fifth divided clock signal 180 deg, and seventh divided clock signal 270 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the fifth divided clock signal 180 deg, and the timing of the rising edge is delayed from the timing of the rising edge of the fifth divided clock signal 180 deg by 90°. Here, the third selection signal SEL2 is in the selected state at the logic level H.

Further, in the fourth AND circuit 54 of the fifth duty cycle setting unit 45, the fourth selection signal SEL3 shown in (A) of FIG. 8 is input to the first input terminal Int, the fifth divided clock signal 180 deg shown in (E) of FIG. 3 is input to the second input terminal Int, and the eighth divided clock signal 315 deg shown in (H) of FIG. 3 is input to the third input terminal In3. The fourth AND circuit 54 calculates the logical product of the input fourth selection signal SEL3, fifth divided clock signal 180 deg, and eighth divided clock signal 315 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the fifth divided clock signal 180 deg, and the timing of the rising edge is delayed from the timing of the rising edge of the fifth divided clock signal 180 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 180° (=180°+) 0° is output from the fifth duty cycle setting unit 45. Further, a clock signal corresponding to this signal is output via the fifth output buffer unit 65 corresponding to the fifth duty cycle setting unit 45.

Similarly, when the second selection signal SEL1 is in the selected state, a clock signal having a duty cycle of 37.5% as shown in (B) of FIG. 4 and a phase difference of 225° (=180°+45°) is output from the fifth duty cycle setting unit 45. Further, a clock signal corresponding to this signal is output via the fifth output buffer unit 65 corresponding to the fifth duty cycle setting unit 45.

When the third selection signal SEL2 is in the selected state, a clock signal having a duty cycle of 25.0% as shown in (C) of FIG. 4 and a phase difference of 270° (=180°+90°) is output from the fifth duty cycle setting unit 45. Further, a clock signal corresponding to this signal is output via the fifth output buffer unit 65 corresponding to the fifth duty cycle setting unit 45.

When the fourth selection signal SEL3 is in the selected state, a clock signal having a duty cycle of 12.5% as shown in (D) of FIG. 4 and a phase difference of 315° (=180°+ 135°) is output from the fifth duty cycle setting unit 45. Further, a clock signal corresponding to this signal is output via the fifth output buffer unit 65 corresponding to the fifth duty cycle setting unit 45.

Next, the operation of the sixth duty cycle setting unit 46 will be further described with reference to FIGS. 2 to 8.

Similarly to the first duty cycle setting unit 41, the first selection signal SEL0 shown in (A) of FIG. 5 is input to the first input terminal Int in the first AND circuit 51 of the sixth duty cycle setting unit 46, the sixth divided clock signal 225 deg shown in (F) of FIG. 3 is input to the second input terminal Int, and the sixth divided clock signal 225 deg shown in (F) of FIG. 3 is input to the third input terminal In3.

As a result, the first AND circuit 51 of the sixth duty cycle setting unit 46 calculates the logical product of the input first selection signal SEL0 and sixth divided clock signal 225 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the sixth divided clock signal 225 deg. Here, the first selection signal SEL0 is in the selected state at the logic level H.

Further, in the second AND circuit 52 of the sixth duty cycle setting unit 46, the second selection signal SEL1 shown in (A) of FIG. 6 is input to the first input terminal In1, and the sixth divided clock signal 225 deg shown in (F) of FIG. 3 is input to the second input terminal Int, and the seventh divided clock signal 270 deg shown in (G) of FIG. 3 is input to the third input terminal In3. The second AND circuit 52 calculates the logical product of the input second selection signal SEL1, sixth divided clock signal 225 deg, and seventh divided clock signal 270 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the sixth divided clock signal 225 deg, and the timing of the rising edge is delayed from the timing of the rising edge of the sixth divided clock signal 225 deg by 45°. Here, the second selection signal SEL1 is in the selected state at the logic level H.

Further, in the third AND circuit 53 of the sixth duty cycle setting unit 46, the third selection signal SEL2 shown in (A) of FIG. 7 is input to the first input terminal In1, the sixth divided clock signal 225 deg shown in (F) of FIG. 3 is input to the second input terminal In2, and the eighth divided clock signal 315 deg shown in (H) of FIG. 3 is input to the third input terminal In3. The third AND circuit 53 calculates the logical product of the input third selection signal SEL2, sixth divided clock signal 225 deg, and eighth divided clock signal 315 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the sixth divided clock signal 225 deg, and the timing of the rising edge is delayed from the timing of the rising edge of the sixth divided clock signal 225 deg by 90°. Here, the third selection signal SEL2 is in the selected state at the logic level H.

Further, in the fourth AND circuit 54 of the sixth duty cycle setting unit 46, the fourth selection signal SEL3 shown in (A) of FIG. 8 is input to the first input terminal In1, the sixth divided clock signal 225 deg shown in (F) of FIG. 3 is input to the second input terminal In2, and the first divided clock signal 0 deg shown in (A) of FIG. 3 is input to the third input terminal In3. The fourth AND circuit 54 calculates the logical product of the input fourth selection signal SEL3, sixth divided clock signal 225 deg, and first divided clock signal 0 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the sixth divided clock signal 225 deg, and the timing of the rising edge is delayed from the timing of the rising edge of the sixth divided clock signal 225 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 225° (=225°+) 0° is output from the sixth duty cycle setting unit 46. Further, a clock signal corresponding to this signal is output via the sixth output buffer unit 66 corresponding to the sixth duty cycle setting unit 46.

Similarly, when the second selection signal SEL1 is in the selected state, a clock signal having a duty cycle of 37.5% as shown in (B) of FIG. 4 and a phase difference of 270° (=225°+45°) is output from the sixth duty cycle setting unit 46. Further, a clock signal corresponding to this signal is output via the sixth output buffer unit 66 corresponding to the sixth duty cycle setting unit 46.

When the third selection signal SEL2 is in the selected state, a clock signal having a duty cycle of 25.0% as shown in (C) of FIG. 4 and a phase difference of 315° (=225°+90°) is output from the sixth duty cycle setting unit 46. Further, a clock signal corresponding to this signal is output via the sixth output buffer unit 66 corresponding to the sixth duty cycle setting unit 46.

When the fourth selection signal SEL3 is in the selected state, a clock signal having a duty cycle of 12.5% as shown in (D) of FIG. 4 and a phase difference of 360°=0° (=225°+135°) is output from the sixth duty cycle setting unit 46. Further, a clock signal corresponding to this signal is output via the sixth output buffer unit 66 corresponding to the sixth duty cycle setting unit 46.

Next, the operation of the seventh duty cycle setting unit 47 will be further described with reference to FIGS. 2 to 8.

Similarly to the first duty cycle setting unit 41, the first selection signal SEL0 shown in (A) of FIG. 5 is input to the first input terminal In1 in the first AND circuit 51 of the seventh duty cycle setting unit 47, the seventh divided clock signal 270 deg shown in (G) of FIG. 3 is input to the second input terminal In2, and the seventh divided clock signal 270 deg shown in (G) of FIG. 3 is input to the third input terminal In3.

As a result, the first AND circuit 51 of the seventh duty cycle setting unit 47 calculates the logical product of the input first selection signal SEL0 and seventh divided clock signal 270 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the seventh divided clock signal 270 deg. Here, the first selection signal SEL0 is in the selected state at the logic level H.

Further, in the second AND circuit 52 of the seventh duty cycle setting unit 47, the second selection signal SEL1 shown in (A) of FIG. 6 is input to the first input terminal In1, and the seventh divided clock signal 270 deg shown in (G) of FIG. 3 is input to the second input terminal In2, and the eighth divided clock signal 315 deg shown in (H) of FIG. 3 is input to the third input terminal In3. The second AND circuit 52 calculates the logical product of the input second selection signal SEL1, the seventh divided clock signal 270 deg, and the eighth divided clock signal 315 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the seventh divided clock signal 270 deg, and the timing of the rising edge is delayed from the timing of the rising edge of the seventh divided clock signal 270 deg by 45°. Here, the second selection signal SEL1 is in the selected state at the logic level H.

In the third AND circuit 53 of the seventh duty cycle setting unit 47, the third selection signal SEL2 shown in (A) of FIG. 7 is input to the first input terminal In1, the seventh divided clock signal 270 deg shown in (G) of FIG. 3 is input to the second input terminal Int, and the first divided clock signal 0 deg shown in (A) of FIG. 3 is input to the third input terminal In3. The third AND circuit 53 calculates the logical product of the input third selection signal SEL2, the seventh divided clock signal 270 deg, and the first divided clock signal 0 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the seventh divided clock signal 270 deg, and the timing of the rising edge is delayed from the timing of the rising edge of the seventh divided clock signal 270 deg by 90°. Here, the third selection signal SEL2 is in the selected state at the logic level H.

In the fourth AND circuit 54 of the seventh duty cycle setting unit 47, the fourth selection signal SEL3 shown in (A) of FIG. 8 is input to the first input terminal In1, the seventh divided clock signal 270 deg shown in (G) of FIG. 3 is input to the second input terminal Int, and the second divided clock signal 45 deg shown in (B) of FIG. 3 is input to the third input terminal In3. The fourth AND circuit 54 calculates the logical product of the input fourth selection signal SEL3, the seventh divided clock signal 270 deg, and the second divided clock signal 45 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the seventh divided clock signal 270 deg, and the timing of the rising edge is delayed from the timing of the rising edge of the seventh divided clock signal 270 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 270° (=270°+) 0° is output from the seventh duty cycle setting unit 47. Further, a clock signal corresponding to this signal is output via the seventh output buffer unit 67 corresponding to the seventh duty cycle setting unit 47.

Similarly, when the second selection signal SEL1 is in the selected state, a clock signal having a duty cycle of 37.5% as shown in (B) of FIG. 4 and a phase difference of 315° (=270°+45°) is output from the seventh duty cycle setting unit 47. Further, a clock signal corresponding to this signal is output via the seventh output buffer unit 67 corresponding to the seventh duty cycle setting unit 47.

When the third selection signal SEL2 is in the selected state, a clock signal having a duty cycle of 25.0% as shown in (C) of FIG. 4 and a phase difference of 360°=0° (=270°+90°) is output from the seventh duty cycle setting unit 47. Further, a clock signal corresponding to this signal is output via the seventh output buffer unit 67 corresponding to the seventh duty cycle setting unit 47.

When the fourth selection signal SEL3 is in the selected state, a clock signal having a duty cycle of 12.5% as shown in (D) of FIG. 4 and a phase difference of 405°=45° (=270°+135°) is output from the seventh duty cycle setting unit 47. Further, a clock signal corresponding to this signal is output via the seventh output buffer unit 67 corresponding to the seventh duty cycle setting unit 47.

Next, the operation of the eighth duty cycle setting unit 48 will be further described with reference to FIGS. 2 to 8.

Similarly to the first duty cycle setting unit 41, the first selection signal SEL0 shown in (A) of FIG. 5 is input to the first input terminal Int in the first AND circuit 51 of the eighth duty cycle setting unit 48, the eighth divided clock signal 315 deg shown in (H) of FIG. 3 is input to the second input terminal Int, and the eighth divided clock signal 315 deg shown in (H) of FIG. 3 is input to the third input terminal In3.

As a result, the first AND circuit 51 of the eighth duty cycle setting unit 48 calculates the logical product of the input first selection signal SEL0 and eighth divided clock signal 315 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and a phase difference of 0° with respect to the eighth divided clock signal 315 deg. Here, the first selection signal SEL0 is in the selected state at the logic level H.

In the second AND circuit 52 of the eighth duty cycle setting unit 48, the second selection signal SEL1 shown in (A) of FIG. 6 is input to the first input terminal In1, and the eighth divided clock signal 315 deg shown in (H) of FIG. 3 is input to the second input terminal Int, and the first divided clock signal 0 deg shown in (A) of FIG. 3 is input to the third input terminal In3. The second AND circuit 52 calculates the logical product of the input second selection signal SEL1, eighth divided clock signal 315 deg, and first divided clock signal 0 deg, and outputs the calculation result shown in (D) of FIG. 6 to the output terminal.

That is, when the second selection signal SEL1 is in the selected state, the second AND circuit 52 outputs a clock signal in which the duty cycle is 37.5% as shown in (B) of FIG. 4, the timing of the falling edge is the same as the timing of the falling edge of the eighth divided clock signal 315 deg, and the timing of the rising edge is delayed from the timing of the rising edge of the eighth divided clock signal 315 deg by 45°. Here, the second selection signal SEL1 is in the selected state at the logic level H.

In the third AND circuit 53 of the eighth duty cycle setting unit 48, the third selection signal SEL2 shown in (A) of FIG. 7 is input to the first input terminal Int, the eighth divided clock signal 315 deg shown in (H) of FIG. 3 is input to the second input terminal Int, and the second divided clock signal 45 deg shown in (B) of FIG. 3 is input to the third input terminal In3. The third AND circuit 53 calculates the logical product of the input third selection signal SEL2, eighth divided clock signal 315 deg, and second divided clock signal 45 deg, and outputs the calculation result shown in (D) of FIG. 7 to the output terminal out.

That is, when the third selection signal SEL2 is in the selected state, the third AND circuit 53 outputs a clock signal in which the duty cycle is 25.0% as shown in (C) of FIG. 4, the timing of the falling edge is the same as the timing of the falling edge of the eighth divided clock signal 315 deg, and the timing of the rising edge is delayed from the timing of the rising edge of the eighth divided clock signal 315 deg by 90°. Here, the third selection signal SEL2 is in the selected state at the logic level H.

In the fourth AND circuit 54 of the eighth duty cycle setting unit 48, the fourth selection signal SEL3 shown in (A) of FIG. 8 is input to the first input terminal Int, the eighth divided clock signal 315 deg shown in (H) of FIG. 3 is input to the second input terminal Int, and the third divided clock signal 90 deg shown in (C) of FIG. 3 is input to the third input terminal In3. The fourth AND circuit 54 calculates the logical product of the input fourth selection signal SEL3, the eighth divided clock signal 315 deg, and the third divided clock signal 90 deg, and outputs the calculation result shown in (D) of FIG. 8 to the output terminal out.

That is, when the fourth selection signal SEL3 is in the selected state, the fourth AND circuit 54 outputs a clock signal in which the duty cycle is 12.5% as shown in (D) of FIG. 4, the timing of the falling edge is the same as the timing of the falling edge of the eighth divided clock signal 315 deg, and the timing of the rising edge is delayed from the timing of the rising edge of the eighth divided clock signal 315 deg by 135°. Here, the fourth selection signal SEL3 is in the selected state at the logic level H.

In the above configuration, the first AND circuit 51 to the fourth AND circuit 54 each constitute an example of the second circuit.

Further, the first selection signal SEL0 to the fourth selection signal SEL3 are exclusively selected. That is, when the first selection signal SEL0 is in the selected state, a clock signal having a duty cycle of 50% as shown in (A) of FIG. 4 and a phase difference of 315° (=315°+) 0° is output from the eighth duty cycle setting unit 48. Further, a clock signal corresponding to this signal is output via the eighth output buffer unit 68 corresponding to the eighth duty cycle setting unit 48.

Similarly, when the second selection signal SEL1 is in the selected state, a clock signal having a duty cycle of 37.5% as shown in (B) of FIG. 4 and a phase difference of 360°=0° (=315°+45°) is output from the eighth duty cycle setting unit 48. Further, a clock signal corresponding to this signal is output via the eighth output buffer unit 68 corresponding to the eighth duty cycle setting unit 48.

When the third selection signal SEL2 is in the selected state, a clock signal having a duty cycle of 25.0% as shown in (C) of FIG. 4 and a phase difference of 405°=45° (=315°+90°) is output from the eighth duty cycle setting unit 48. Further, a clock signal corresponding to this signal is output via the eighth output buffer unit 68 corresponding to the eighth duty cycle setting unit 48.

When the fourth selection signal SEL3 is in the selected state, a clock signal having a duty cycle of 12.5% as shown in (D) of FIG. 4 and a phase difference of 450°=90° (=315°+135°) is output from the eighth duty cycle setting unit 48. Further, a clock signal corresponding to this signal is output via the eighth output buffer unit 68 corresponding to the eighth duty cycle setting unit 48.

According to the above configuration, a clock signal CLK having a duty cycle corresponding to the state selected by any one of the first selection signal SEL0 to the fourth selection signal SEL3 (any one of the duty cycles of 50.0%, 37.5%, 25.0% or 12.5%) and having any one of the phase differences of 0 deg to 315 deg is output from each of the output buffer units 61 to 68.

As a result, according to the present embodiment, since the configuration of the duty cycle adjustment circuit can be simplified and the phase state of the clock signal output from the divide-by-4 frequency divider 23 can be maintained, the PVT (processing of the semiconductor integrated device, voltage, and temperature) can be reduced, thereby reducing variations in the duty cycle.

Next, a modification of an embodiment will be described. In this modification, a duty cycle setting circuit 25a having a configuration different from that of the duty cycle setting circuit 25 in the clock circuit 12 is used.

Figure 9:
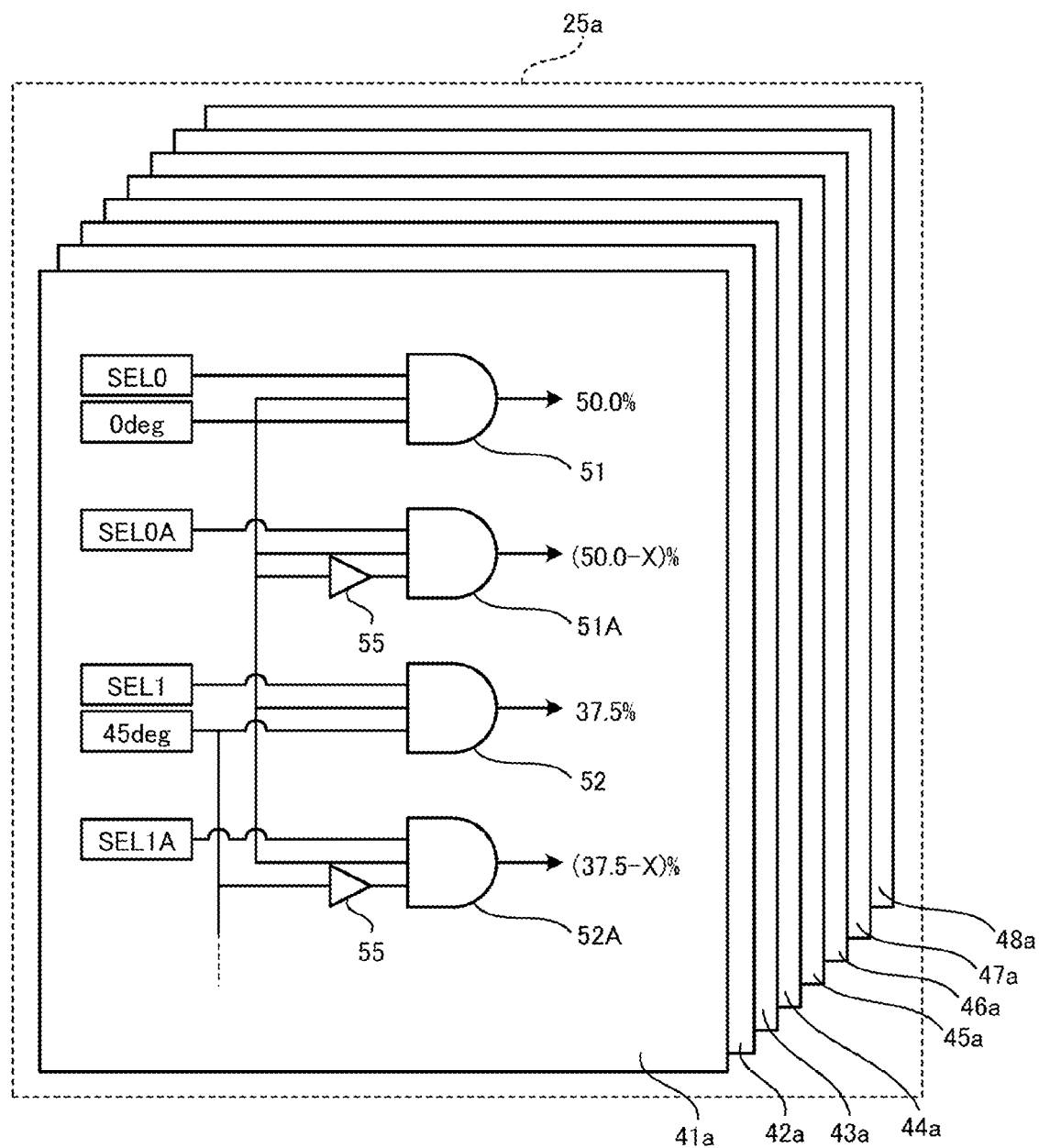
FIG. 9 is a block diagram showing a configuration of a duty cycle setting circuit according to a modification of the embodiment.

FIG. 9 is a block diagram showing a configuration of the duty cycle setting circuit 25a according to the modification.

In FIG. 9, the same parts as those already depicted in FIG. 2 are denoted by the same reference numerals.

In FIG. 9, the difference from FIG. 2 is that a fifth AND circuit 51A, a sixth AND circuit 52A, and two delay circuits 55 are provided in order to increase the number of steps for changing the duty cycle. In FIG. 9, for the sake of easier understanding, the third AND circuit 53, the fourth AND circuit 54, and the corresponding parts are not shown, but should be understood to be included.

The duty cycle setting circuit 25a includes first to eighth duty cycle setting units 41a to 48a, similarly to the duty cycle setting circuit 25. The first to eighth duty cycle setting units 41a to 48a each have the same individual configuration. Here, the first duty cycle setting unit 41a will be described as a representative example.

The first duty cycle setting unit 41a includes the first to fourth AND circuits 51 to 54, the fifth AND circuit 51A, the sixth AND circuit 52A, and two delay circuits 55.

The first to sixth AND circuits 51 to 54, 51A, and 52A each have the first input terminal In1, the second input terminal In2, the third input terminal In3, and the output terminal out. The first to sixth AND circuits 51 to 54, 51A, and 52A each have the same configuration.

The first to sixth AND circuits 51 to 54, 51A, and 52A calculate the logical product of the signals input to each of the first input terminal In1, the second input terminal In2, and the third input terminal In3, and outputs the result of the calculation from the output terminal out.

Here, since the operations of the first to eighth duty cycle setting units 41a to 48a are the same, the operation of the first duty cycle setting unit 41 will be described as representative.

As shown in FIG. 9, in the first AND circuit 51 of the first duty cycle setting unit 41, the first selection signal SEL0 shown in (A) of FIG. 5 is input to the first input terminal Int, the first divided clock signal 0 deg shown in (B) of FIG. 5 is input to the second input terminal In2, and the first divided clock signal 0 deg shown in (C) of FIG. 5 is input to the third input terminal In3.

As a result, the first AND circuit 51 of the first duty cycle setting unit 41 calculates the logical product of the input first selection signal SEL0 and first divided clock signal 0 deg, and outputs the calculation result shown in (D) of FIG. 5 to the output terminal out.

That is, when the first selection signal SEL0 is in the selected state, the first AND circuit 51 outputs a clock signal having a duty cycle of 50% as shown in (A) of FIG. 4 and (D) of FIG. 5 and a phase difference of 0° with respect to the first divided clock signal 0 deg that is the reference clock signal. Here, the first selection signal SEL0 is in the selected state at the logic level H.

FIG. 10 is a schematic timing chart to explain the processing of the fifth AND circuit.

As shown in FIG. 9, in the fifth AND circuit 51A of the first duty cycle setting unit 41, the fifth selection signal SEL0A shown in FIG. 10(A) is input to the first input terminal In1, the first divided clock signal 0 deg shown in FIG. 10(B) is input to the second input terminal Int, and the delay first divided clock signal 0 deg (delay X %) having a delay amount corresponding to the duty cycle X % shown in FIG. 10(C) is input to the third input terminal In3 via the delay circuit 55.

As a result, the fifth AND circuit 51A of the first duty cycle setting unit 41 calculates the logical product of the input fifth selection signal SEL0A, first divided clock signal 0 deg, and delay first divided clock signal 0 deg (delay X %), and outputs the calculation result shown in FIG. 10(D) to the output terminal out.

That is, when the fifth selection signal SEL0A is in the selected state, the fifth AND circuit 51A outputs a clock signal in which the duty cycle (50−X) % as shown in FIG. 10(D), the timing of the falling edge is the same as the timing of the falling edge of the first divided clock signal 0 deg, and the timing of the rising edge is delayed from the timing of the rising edge of the first divided clock signal 0 deg by the phase difference corresponding to the delay X %. Here, the fifth selection signal SEL0A is in the selected state at the logic level H.

In the second AND circuit 52 of the first duty cycle setting unit 41, the second selection signal SEL1 shown in (A) of FIG. 6 is input to the first input terminal In1, and the first divided clock signal 0 deg shown in (B) of FIG. 6 is input to the second input terminal In2, and the second divided clock signal 45 deg shown in (C) of FIG. 6 is input to the third input terminal In3. The second AND circuit 52 calculates the logical product of the input second selection signal SEL1, first divided clock signal 0 deg, and second divided clock signal 45 deg, and outputs the calculation result shown in (D) of FIG. 6 to the output terminal out.

That is, when the second selection signal SEL1 is in the selected state, the second AND circuit 52 outputs a clock signal in which the duty cycle of 37.5% as shown in (D) of FIG. 6, the timing of a falling edge is the same as the timing of the falling edge of the first divided clock signal 0 deg, and the timing of the rising edge is delayed from the timing of the rising edge of the first divided clock signal 0 deg by 45°. Here, the second selection signal SEL1 is in the selected state at the logic level H.

As shown in FIG. 9, in the sixth AND circuit 52A of the first duty cycle setting unit 41, the sixth selection signal SEL1A is input to the first input terminal In1, the second divided clock signal 45 deg is input to the second input terminal In2, and the delay second divided clock signal 45 deg (delay X %) having a delay amount corresponding to the duty cycle X % is input to the third input terminal In3 via the delay circuit 55.

As a result, the sixth AND circuit 52A of the first duty cycle setting unit 41 calculates the logical product of the input sixth selection signal SEL1A, second divided clock signal 45 deg, and delay second divided clock signal 45 deg (delay X %), and outputs the calculation result to the output terminal out.

That is, similarly to the fifth AND circuit 51A, when the sixth selection signal SEL1A is in the selected state, the sixth AND circuit 52A outputs a clock signal in which the duty cycle is (50−X) %, the timing of the falling edge is the same as the timing of the falling edge of the second divided clock signal 45 deg, and the timing of the rising edge is delayed from the timing of the rising edge of the second divided clock signal 45 deg by the phase difference corresponding to the delay X %. Here, the sixth selection signal SEL1A is in the selected state at the logic level H.

The delay amount of the delay circuit 55 only needs to be set as a relative delay amount from the phase deviated by 45° units and may be achieved by a delay element having a small delay amount. Depending on the manufacturing process of the semiconductor integrated circuit and the characteristics of the used transistors, for example, in the case of a clock frequency of 7 GHz, it is possible to set X to about 5% in a two-stage NOT circuit and the capacitance element and the resistance element are not required.

The above described case where the X % duty cycle is reduced only when the duty cycle is 50% or the duty cycle is 37.5%, but the same can be applied to the cases where the duty cycle is 25% and the duty cycle is 12.5%.

It is possible to increase the number of steps for changing the duty cycle by connecting AND circuits in parallel, but since the circuit scale of the intermediate buffer 24 in the previous stage increases accordingly, it is desirable to set the number of steps appropriately.

In the above description, all of the eight-phase output signals output from the divide-by-4 frequency divider 23 corresponding to the frequency division number N=4 are used, but unnecessary outputs such as when only 4 phases are used may be omitted.

In the above description, the four duty cycles (50.0%, 37.5%, 25.0%, and 12.5%) in units of 12.5% are set by using a divided clock of eight phases (=2×N) with a divide-by-4 frequency divider corresponding to the number of frequency division N=4 as the frequency divider. However, when 64 phases (2×N phases) are generated using a divide-by-32 frequency divider (N=32) as the frequency diver, it is also possible to configure the duty cycle to be set in 32 steps in units of 1.5625%.

However, among the duty cycles that can be set, the AND circuit thereof may be omitted for unnecessary duty cycles.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor integrated circuit, comprising:
a first circuit configured to divide a first pulse signal having a first duty cycle by N (where N is an integer of 2 or more), the first pulse signal being a pair of differential signals, and output 2×N second pulse signals with phases which are different from each other; and
a second circuit configured to receive one or more selection signals and calculate a logical product of one of the one or more selection signals and two of the 2×N second pulse signals to generate a third pulse signal having a second duty cycle less than the first duty cycle.

2. The semiconductor integrated circuit according to claim 1, wherein phases of the 2×N second pulse signals are equally separated by 180/N degrees.

3. The semiconductor integrated circuit according to claim 1, wherein
the second circuit includes a plurality of AND circuits, each of the AND circuits having three input terminals that receive one of the one or more selection signals and two of the 2×N second pulse signals, and
a combination of the two of the 2×N second pulse signals is different from each other among the plurality of AND circuits.

4. The semiconductor integrated circuit according to claim 1, wherein
the one or more selection signals comprise N selection signals,
the second circuit includes a plurality of AND circuits, each of the AND circuits having three input terminals that receive one of the N selection signals and two of the 2×N second pulse signals, and a combination of the one of the N signals and the two of the 2×N second pulse signals is different from each other among the plurality of AND circuits.

5. The semiconductor integrated circuit according to claim 4, wherein the number of the plurality of AND circuits is 8×N.

6. The semiconductor integrated circuit according to claim 1, wherein the first duty cycle is 50%.

7. The semiconductor integrated circuit according to claim 6, wherein the second duty cycle is one of 12.5%, 25%, and 37.5%.

8. The semiconductor integrated circuit according to claim 1, wherein the second circuit includes a delay circuit, and the two of the 2×N second pulse signals from which the third pulse signal is generated comprise a fourth pulse signal that is not delayed by the delay circuit and a fifth pulse signal that is delayed by the delay circuit.

9. The semiconductor integrated circuit according to claim 8, wherein a delay caused by the delay circuit corresponds to a duty cycle of less than 50%.

10. The semiconductor integrated circuit according to claim 1, wherein the third pulse signal is a clock signal.

11. A receiving device, comprising:
an equalizing circuit configured to receive an analog signal and output a compensated analog signal;
a clock circuit including:
a first circuit configured to divide a first clock signal having a first duty cycle by N (where N is an integer of 2 or more), the first clock signal being a pair of differential signals, and output 2×N second clock signals with phases which are different from each other; and
a second circuit configured to receive one or more selection signals and calculate a logical product of one of the one or more selection signals and two of the 2×N second clock signals to generate a third clock signal having a second duty cycle less than the first duty cycle; and
a conversion circuit configured to perform analog-to-digital conversion of the compensated analog signal using the third clock signal.

12. The receiving device according to claim 11, wherein phases of the 2×N second clock signals are equally separated by 180/N degrees.

13. The receiving device according to claim 11, wherein the second circuit includes a plurality of AND circuits, each of the AND circuits having three input terminals that receive one of the one or more selection signals and two of the 2×N second clock signals, and
a combination of the two of the 2×N second clock signals is different from each other among the plurality of AND circuits.

14. The receiving device according to claim 11, wherein the one or more selection signals comprise N selection signals,
the second circuit includes a plurality of AND circuits, each of the AND circuits having three input terminals that receive one of the N selection signals and two of the 2×N second clock signals, and
a combination of the one of the N signals and the two of the 2×N second clock signals is different from each other among the plurality of AND circuits.

15. The receiving device according to claim 14, wherein the number of the plurality of AND circuits is 8×N.

16. The receiving device according to claim 11, wherein the first duty cycle is 50%.

17. The receiving device according to claim 16, wherein the second duty cycle is one of 12.5%, 25%, and 37.5%.

18. The receiving device according to claim 11, wherein the second circuit includes a delay circuit, and the two of the 2×N second clock signals from which the third clock signal is generated comprise a fourth clock signal that is not delayed by the delay circuit and a fifth clock signal that is delayed by the delay circuit.

19. The receiving device according to claim 18, wherein a delay caused by the delay circuit corresponds to a duty cycle of equal to or less than 50/N %.

20. The receiving device according to claim 11, wherein the analog-to-digital conversion performed by the conversion circuit includes a time-interleaved analog-to-digital conversion.

* * * * *